United States Patent
Kaneko et al.

(10) Patent No.: US 8,540,376 B2
(45) Date of Patent: Sep. 24, 2013

(54) PROJECTOR

(75) Inventors: Tsuyoshi Kaneko, Shimosuwa (JP); Takashi Takeda, Suwa (JP)

(73) Assignee: Seiko Epson Corporation (JP)

( * ) Notice: Subject to any disclaimer, the term of this patent is extended or adjusted under 35 U.S.C. 154(b) by 259 days.

(21) Appl. No.: 12/879,357

(22) Filed: Sep. 10, 2010

(65) Prior Publication Data

US 2011/0069282 A1    Mar. 24, 2011

(30) Foreign Application Priority Data

Sep. 18, 2009 (JP) ................................ 2009-217191

(51) Int. Cl.
| | |
|---|---|
| *G03B 21/26* | (2006.01) |
| *F21V 5/00* | (2006.01) |
| *F21V 5/02* | (2006.01) |
| *H01L 33/00* | (2010.01) |

(52) U.S. Cl.
USPC ................ 353/94; 362/326; 362/339; 257/98

(58) Field of Classification Search
USPC .................... 353/85, 122, 94; 362/326, 339, 362/800, 311.06, 311.01; 372/46.012, 92, 372/93, 97, 43.01, 45.01, 46.01, 46.011; 257/98, 101, 102, 81, 91
See application file for complete search history.

(56) References Cited

U.S. PATENT DOCUMENTS

| | | | |
|---|---|---|---|
| 4,971,415 A | 11/1990 | Hara et al. | |
| 6,517,211 B2 * | 2/2003 | Mihara | ........................... 353/98 |
| 6,542,529 B1 * | 4/2003 | Hagberg et al. | ............. 372/46.01 |
| 2006/0215129 A1 * | 9/2006 | Alasaarela et al. | ............. 353/94 |

FOREIGN PATENT DOCUMENTS

| | | |
|---|---|---|
| JP | 61-127190 | 6/1986 |
| JP | 04-097206 B2 | 3/1992 |
| JP | 09-083048 | 3/1997 |
| JP | 2001-042431 A | 2/2001 |
| JP | 2002-319176 | 10/2002 |
| JP | 2007-165689 | 6/2007 |
| JP | 2007-273690 | 10/2007 |
| JP | 2009-238848 | 10/2009 |

* cited by examiner

*Primary Examiner* — William C Dowling
*Assistant Examiner* — Ryan Howard
(74) *Attorney, Agent, or Firm* — Harness, Dickey & Pierce, P.L.C.

(57) ABSTRACT

A projector includes: a light emitter; a light modulator modulating light from the light emitter; and a projector projecting the image from the light modulator. The light emitter includes a light emitting element and an optical member. The light emitting element is a super luminescent diode having an active layer constituting first and second gain regions sandwiched between first and second cladding layers. The first gain region is tilted in a clockwise direction relative a perpendicular of a first surface of the stacked structure. The second gain region is tilted in a counterclockwise direction relative to a perpendicular of the first surface. As such, the optical member refracts the light respectively emitted from the end surfaces of the first and second gain regions on the second surface side to thereby emit light beams in the same direction.

8 Claims, 7 Drawing Sheets

PROJECTOR

BACKGROUND

1. Technical Field

The present invention relates to a projector.

2. Related Art

A super luminescent diode (hereinafter also referred to as an "SLD") is a semiconductor element capable of providing an output up to several tens of mW in the light output characteristic similarly to a semiconductor laser while showing an incoherent property and a wideband spectrum shape similarly to an ordinary light emitting diode. Similarly to a semiconductor laser, the SLD uses a mechanism in which the spontaneous-emission light generated by the recombination of the injected carriers is amplified in accordance with a high gain due to the stimulated emission while proceeding toward a light emitting end surface, and then emitted from the light emitting end surface. It should be noted that unlike the semiconductor laser the SLD requires to prevent formation of the resonator due to the end surface reflection, thereby preventing the laser oscillation from occurring.

As a measure for preventing the laser oscillation, there has been known a configuration of tilting the gain region (optical waveguide) with respect to the emission end surface as shown in, for example, JP-A-2007-165689. In the technology described in the document mentioned above, two such linear optical waveguides tilted with respect to the emission end surface are formed in order for achieving high output power.

In the light emitting element provided with the linear gain regions (optical waveguides) tilted with respect to the emission end surface as described above, the light beams emitted from the plurality of gain regions might proceed in respective directions different from each other in some cases. However, if the SLD is used as a light source of a projector, it is preferable that the light beams emitted from the SLD proceed in the same direction. According to such an SLD, it is possible to make the light axis adjustment in the projector easier.

SUMMARY

An advantage of some aspects of the invention is to provide a projector, which is provided with a light emitting device for making the light beams emitted from a plurality of gain regions proceed in the same direction, and is easy in adjusting the light axis.

According to an aspect of the invention, there is provided a projector including a light emitting device, a light modulation device adapted to modulate a light beam emitted from the light emitting device in accordance with image information, and a projection device adapted to project the image formed by the light modulation device, wherein the light emitting device includes a light emitting element, and an optical member which a light beam emitted from the light emitting element enters, the light emitting element is a super luminescent diode provided with a stacked structure having an active layer sandwiched between a first cladding layer and a second cladding layer, at least a part of the active layer constitutes a first gain region and a second gain region which become current channels of the active layer, a first surface and a second surface out of exposed surfaces of the active layer opposed to each other in the stacked structure, the first gain region is disposed linearly from the first surface to the second surface of the active layer so as to be tilted in a clockwise direction with respect to a perpendicular of the first surface in a plan view along a stacking direction of the stacked structure, the second gain region is disposed linearly from the first surface to the second surface of the active layer so as to be tilted in a counterclockwise direction with respect to a perpendicular of the first surface in the plan view along the stacking direction of the stacked structure, and the optical member refracts the light beams emitted respectively from an end surface of the first gain region on the second surface side and an end surface of the second gain region on the second surface side to thereby emit the light beams as light beams proceeding in the same direction.

According to such a projector as described above, the light emitting device making the light beams emitted from the at least first gain region and at least one second gain region proceed in the same direction is provided, and it becomes possible to make the light axis adjustment easier.

In the projector of the above aspect of the invention, it is also possible that the proceeding direction of the light beams emitted from the optical member is a direction of a perpendicular of the second surface.

According to such a projector as described above, the positions of the entrance surface and the exit surface of the optical member can be determined using the second surface as a reference. Thus, it becomes possible to make the alignment between the light emitting element and the optical member easier.

In the projector of the above aspect of the invention, it is also possible that the first gain region and the second gain region constitute a V-shaped gain region in which an end surface of the first gain region on the first surface side and an end surface of the second gain region on the first surface side overlap each other on the first surface, and a reflectance of the first surface is higher than a reflectance of the second surface in a wavelength band of light generated in the first gain region and the second gain region.

According to such a projector as described above, some of the light generated in the first gain region is reflected by an overlapping plane (an overlapping plane between the end surface of the first gain region on the first surface side and the end surface of the second gain region on the first surface side), and can further proceed in the second gain region while obtaining the gain. Further, the same can be applied to some of the light generated in the second gain region. Therefore, since the distance for amplifying the light intensity becomes longer compared to the case in which, for example, the light is not actively reflected by the overlapping plane, the high light output can be obtained.

In the projector of the above aspect of the invention, it is also possible that the number of the first gain region is more than one, and the number of the second gain region is more than one.

According to such a projector, higher output of the whole light emitting device can be achieved.

In the projector of the above aspect of the invention, it is also possible that the optical member has a translucency to a wavelength of the light beams emitted from the light emitting element.

According to such a projector, the absorption loss of the light can be reduced.

In the projector of the above aspect of the invention, it is also possible that at least one of a light entrance area and a light exit area of the optical member is covered by a reflection reduction member.

According to such a projector, the reflection loss of the light can be reduced on at least either one of the entrance surface and the exit surface of the optical member.

In the projector of the above aspect of the invention, it is also possible that the light emitting element is mounted to a support member, a thermal conductivity of the support member is higher than a thermal conductivity of the light emitting element, and the active layer is disposed on the support member side in the light emitting element.

According to such a projector as described above, the light emitting device can have high heat radiation performance.

In the projector of the above aspect of the invention, it is also possible that the light emitting element is mounted to a support member, the active layer is disposed on a side opposite to the support member side in the light emitting element, the stacked structure further includes a substrate, and the substrate is disposed between the active layer and the support member.

According to such a projector as described above, since the substrate is disposed between the active layer and the support member, the active layer is disposed at the position at least by the thickness of the substrate further from the support member. Therefore, the outgoing light beam with a much preferable shape (cross-sectional shape) can be obtained.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Figure 1:
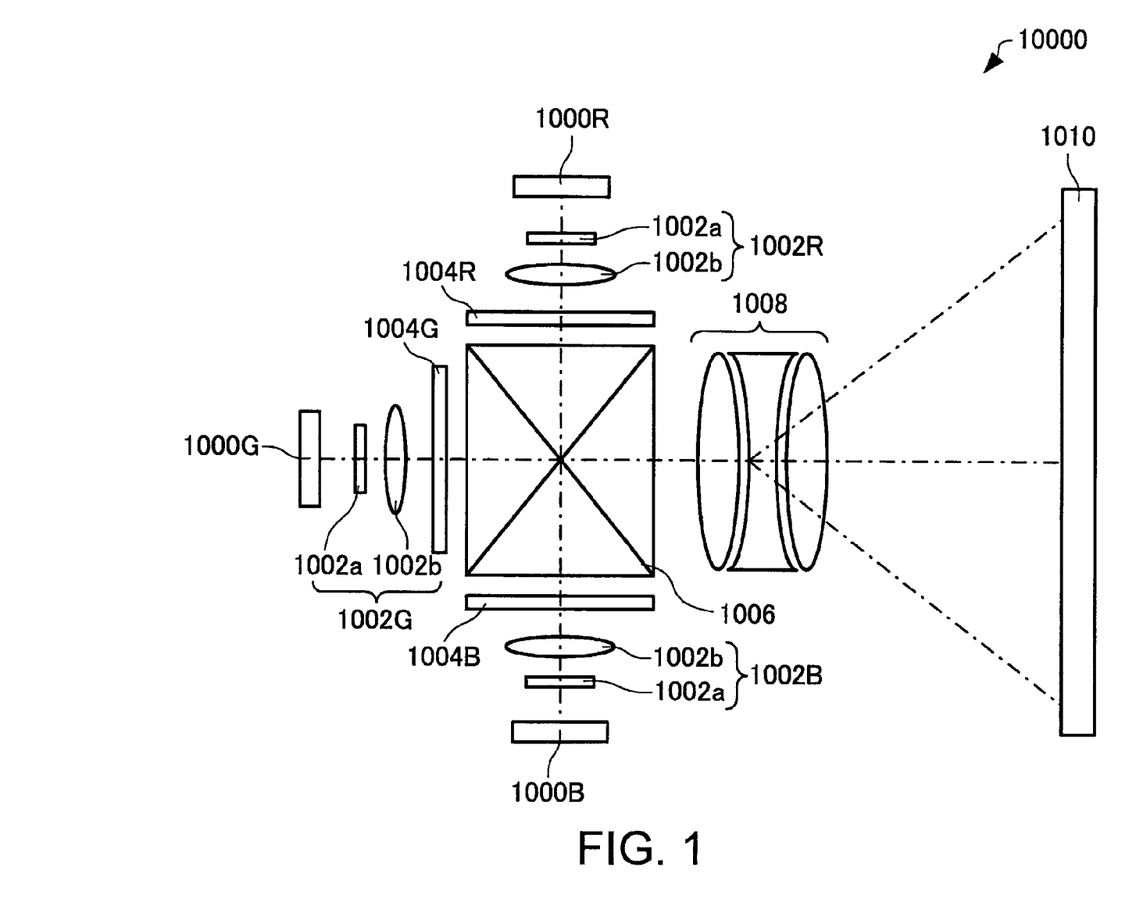
FIG. 1 is a diagram schematically showing a projector according to an embodiment of the invention.

An exemplary embodiment of the invention will hereinafter be described with reference to the accompanying drawings.
1. Projector Firstly, a projector 10000 according to the present embodiment will be explained with reference to the accompanying drawings. FIG. 1 is a diagram schematically showing the projector 10000. It should be noted that in FIG. 1, a housing for constituting the projector 10000 is omitted for the sake of convenience. The projector 10000 includes a light emitting device according to the invention. Hereinafter, an example of using a light emitting device 1000 as the light emitting device according to the invention will be explained.

In the projector 10000, a red light source (light emitting device) 1000R, a green light source (light emitting device) 1000G, and a blue light source (light emitting device) 1000B for emitting a red light beam, a green light beam, and a blue light beam, respectively, each correspond to the light emitting device 1000 described above.

The projector 10000 is provided with transmissive liquid crystal light valves (light modulation devices) 1004R, 1004G, and 1004B for modulating the light beams emitted from the light sources 1000R, 1000G, and 1000B, respectively, in accordance with image information, and a projection lens (projection device) 1008 for magnifying the images respectively formed by the liquid crystal light valves 1004R, 1004G, and 1004B and then projecting the images thus magnified on a screen (display surface) 1010. Further, the projector 10000 is provided with a cross dichroic prism (a colored light combining section) 1006 for combining the light beams emitted from the liquid crystal light valves 1004R, 1004G, and 1004B and then guiding the combined light beam to the projection lens 1008.

Further, in order for equalizing the illumination distribution of the light beams emitted from the light sources 1000R, 1000G, and 1000B, the projector 10000 is provided with equalizing optical systems 1002R, 1002G, and 1002B disposed downstream of the light sources 1000R, 1000G, and 1000B, respectively, along the optical paths, and illuminates the liquid crystal light valves 1004R, 1004G, and 1004B with the light beams having the illumination distribution equalized by the equalizing optical systems 1002R, 1002G, and 1002B. The equalizing optical systems 1002R, 1002G, and 1002B are each composed of, for example, a hologram 1002a and a field lens 1002b.

The three colored light beams modulated by the respective liquid crystal light valves 1004R, 1004G, and 1004B enter the cross dichroic prism 1006. This prism is formed by bonding four rectangular prisms, and is provided with a dielectric multilayer film for reflecting the red light beam and a dielectric multilayer film for reflecting the blue light beam disposed on the inside surfaces so as to form a crisscross. The three colored light beams are combined by these dielectric multilayer films to form a light beam representing a color image. Further, the light beam obtained by combining the three colored light beams is projected on the screen 1010 by the projection lens 1006 as the projection optical system, thus an enlarged image is displayed.

It should be noted that although the transmissive liquid crystal light valves are used as the light modulation devices in the example described above, it is also possible to use light valves other than the liquid crystal light valves, or to use reflective light valves. As such light valves, reflective liquid crystal light valves, digital micromirror devices, for example, can be cited. Further, the configuration of the projection optical system is appropriately modified in accordance with the type of the light valves used therein.

Further, by scanning the light from the light emitting device 1000 on the screen, it is possible to apply the light emitting device 1000 also to the light emitting device (the light source device) of a scanning type image display device (a projector) having a scanning section as an image forming device for displaying an image with a desired size on the display surface.

According to the projector 10000, since the light emitting devices according to the invention can be used as the light sources, the light axis adjustment becomes easy. The configuration and so on of the light emitting device used for the projector 10000 will hereinafter be explained.

2. Light Emitting Device

Figure 2:
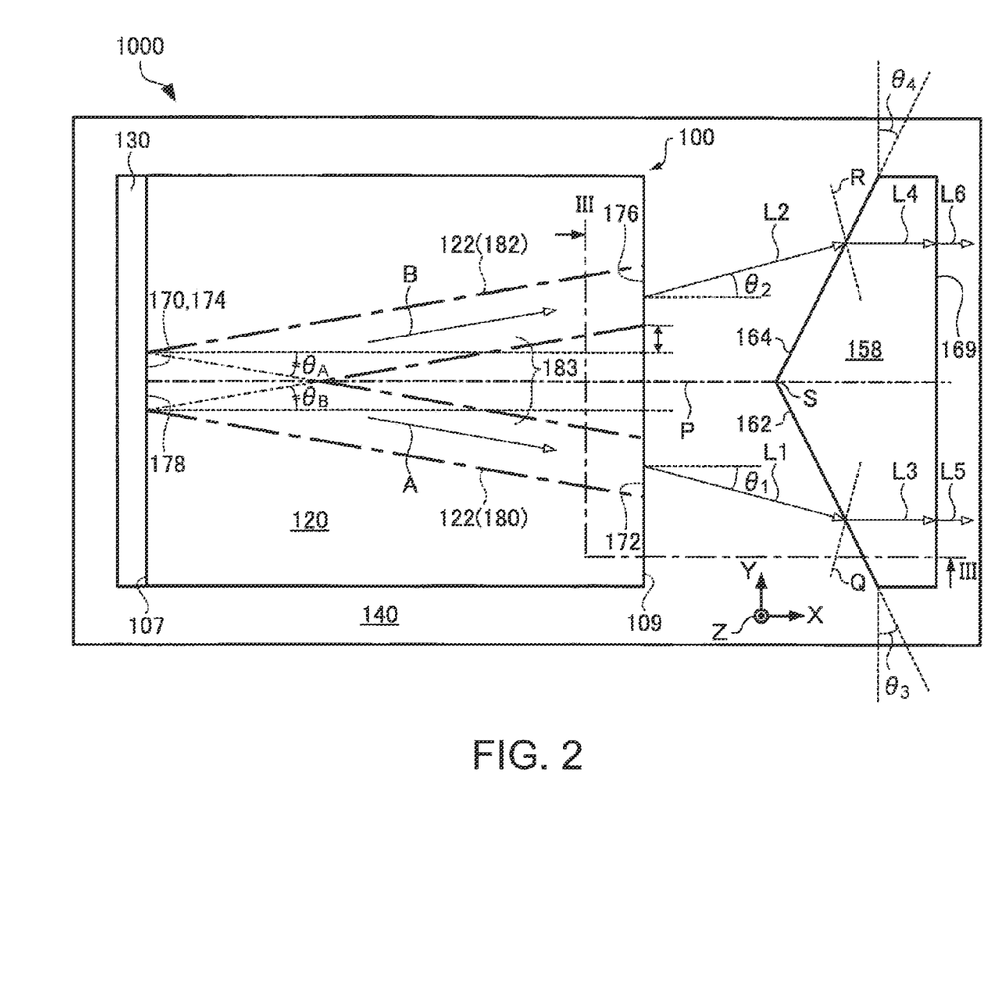
FIG. 2 is a plan view schematically showing a light emitting device used for the projector according to the present embodiment.
Figure 3:
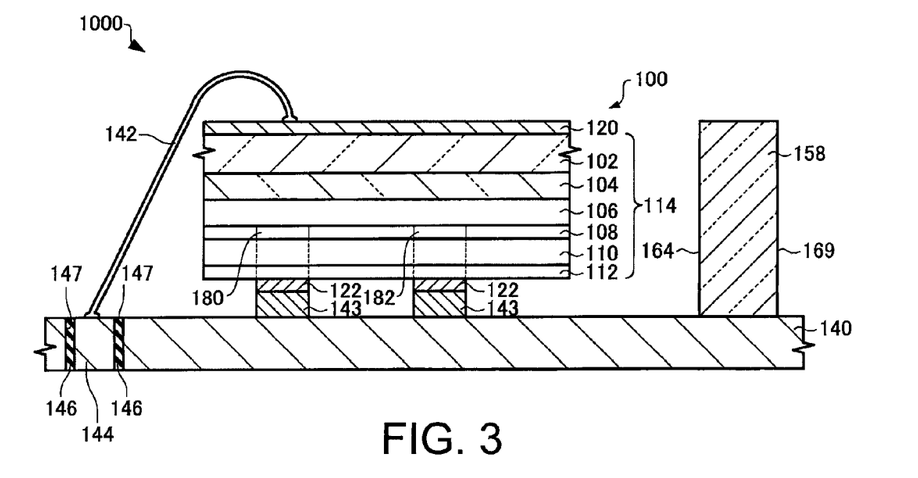
FIG. 3 is a cross-sectional view schematically showing the light emitting device used for the projector according to the present embodiment.

Then, the light emitting device 1000 used for the projector 10000 according to the present embodiment will be explained with reference to the accompanying drawings. FIG. 2 is a plan view schematically showing the light emitting device 1000. FIG. 3 is a cross-sectional view along the III-III line shown in FIG. 2 schematically showing the light emitting device 1000.

As shown in FIGS. 2 and 3, the light emitting device 1000 includes a light emitting element 100 and an optical member 158. The light emitting device 1000 can further include a support member 140. It should be noted that the case in which the light emitting element 100 is an InGaAlP type (red) SLD will be explained here. Unlike the semiconductor laser, in the SLD the laser oscillation can be prevented by suppressing formation of the resonator due to the end surface reflection. Therefore, the speckle noise can be reduced.

The light emitting element 100 is mounted on a support member 140. The light emitting element 100 can further include a stacked structure 114, a first electrode 122, and a second electrode 120. The stacked structure 114 has a cladding layer (hereinafter referred to as a "first cladding layer") 110, an active layer 108 formed thereon, and another cladding layer (hereinafter referred to as a "second cladding layer") 106 formed thereon. Further, the stacked structure can include a substrate 102, a buffer layer 104, and a contact layer 112.

As the substrate 102, a first conductivity type (e.g., an n-type) GaAs substrate, for example, can be used.

As shown in, for example, FIG. 3, the buffer layer 104 can be formed under the substrate 102. The buffer layer 104 can improve the crystallinity of a layer to be formed above the buffer layer 104 in, for example, the epitaxial growth process described later (see FIG. 4). As the buffer layer 104, it is possible to use, for example, a GaAs layer or an InGaP layer of the first conductivity type (n-type) having crystallinity much preferable (e.g., having the defect density lower than that of the substrate 102) to that of the substrate 102.

As shown in FIG. 3, the second cladding layer 106 is formed under the buffer layer 104. The second cladding layer 106 is formed of, for example, a semiconductor of the first conductivity type. As the second cladding layer 106, an n-type AlGaInP layer, for example, can be used.

The active layer 108 is formed under the second cladding layer 106. The active layer 108 is disposed on the side of the support member 140 in the light emitting element 100, for example. In other words, the active layer 108 is disposed, for example, on the lower side (the side opposite to the side of the substrate 102) of the midpoint of the thickness direction of the light emitting element 100. The active layer 108 has, for example, a multiple quantum well (MQW) structure having three quantum well structures stacked one another each composed of an InGaP well layer and an InGaAlP barrier layer.

The shape of the active layer 108 is, for example, a rectangular solid (including a cube). As shown in FIG. 2, the active layer 108 has a first surface 107 and a second surface 109. The first surface 107 and the second surface 109 are the surfaces of the active layer 108 having no contact with the first cladding layer 110 or the second cladding layer 106, and are exposed surfaces of the stacked structure 114. The first surface 107 and the second surface 109 can also be called side surfaces of the active layer 108. The first surface 107 and the second surface 109 are opposed to each other, and are parallel to each other in the example shown in the drawing.

Some parts of the active layer 108 constitute a plurality of gain regions. For example, in the example shown in the drawing, the active layer 108 has two gain regions (a first gain region 180 and a second gain region 182). It is possible to generate light in the gain regions 180, 182, and the light can be provided with gains inside the gain regions 180, 182. The gain regions 180, 182 can form current channels of the active layer 108. In the wavelength band of the light generated in the gain regions 180, 182, the reflectance of the first surface 107 is higher than the reflectance of the second surface 109. For example, as shown in FIG. 2, the high reflectance can be obtained by covering the first surface 107 with a reflecting section 130. As the reflecting section 130, it is possible to use, for example, a dielectric multilayer mirror having 4 pairs of layers of $Al_2O_3$ and $TiO_2$ stacked in this order from the side of the first surface 107. It is preferable that the reflectance of the first surface 107 is 100% or approximately 100%. In contrast thereto, it is preferable that the reflectance of the second surface 109 is 0% or approximately 0%. For example, by covering the second surface 109 with a reflection reduction section (not shown), it is possible to obtain low reflectance. As the reflection reduction section, a single layer of $Al_2O_3$, for example, can be used.

Each of the gain regions 180, 182 is disposed linearly from the first surface 107 to the second surface 109 toward a direction tilted with respect to a perpendicular P of the first surface 107 in a plan view of the active layer 108 in the stacking direction (in a plan view in the thickness direction of the active layer 106; see FIG. 2). Thus, the laser oscillation of the light generated in the gain regions 180, 182 can be suppressed or prevented. The first gain region 180 and the second gain region 182 are disposed in respective directions different from each other. In the example shown in the drawing, the first gain region 180 is tilted toward one side with respect to the perpendicular P, and is disposed in a direction (hereinafter also referred to as a "first direction") A at an angle θA with respect to the perpendicular P. Further, the second gain region 182 is tilted toward the other side (the side opposite to the one side) with respect to the perpendicular P, and is disposed in a direction (hereinafter also referred to as a "second direction") B at an angle $θ_B$ with respect to the perpendicular P. The tilt angle $θ_A$ of the first gain region 180 and the tilt angle $θ_B$ of the second gain region 182 are the same in the example shown in the drawing, but can be different from each other. It can be said that the first gain region 180 is disposed so as to be tilted in the clockwise direction with respect to the perpendicular P of the first surface 107 in the plan view of the active layer 108 along the stacking direction. Further, it can also be said that the second gain region 182 is disposed so as to be tilted in the counterclockwise direction with respect to the perpendicular P of the first surface 107 in the plan view of the active layer 108 along the stacking direction.

In the example shown in the drawing, a first end surface 170 of the first gain region 180 on the side of the first surface 107 and a third end surface 174 of the second gain region 182 on the side of the first surface 107 completely overlap each other. However, it is also possible that the first end surface 170 and the third end surface 174 can overlap each other partially, for example, although not shown in the drawing. The first gain region 180 and the second gain region 182 can form a V-type gain region 183. The planar shape of the first gain region 180 and the planar shape of the second gain region 182 can be axisymmetrical with each other about, for example, the perpendicular P inside the first end surface 170 or the third end surface 174. The planar shape of the first gain region 180 and the planar shape of the second gain region 182 are axisymmetrical with each other about, for example, a perpendicular bisector P of an overlapping plane 178. The planar shape of each of the first gain region 180 and the second gain region 182 is, for example, a parallelogram as shown in FIG. 2. It should be noted that it is also possible that the first end surface 170 and third end surface 174 do not overlap each other although not shown in the drawings. In other words, it is not required for the first gain region 180 and the second gain region 182 to overlap each other.

Further, the width of each of the end surfaces 172, 176 of the first gain region 180 and the second gain region 182 on the side of the second surface 109 is the same as the width of the end surfaces 170, 174 on the side of the first surface 107 in the example shown in FIG. 2, but can be different from each other.

The first cladding layer 110 is formed under the active layer 108. The first cladding layer 110 is made of, for example, a semiconductor of a second conductivity type (e.g., a p-type). As the first cladding layer 110, a p-type AlGaInP layer, for example, can be used.

For example, a pin diode is composed of the p-type first cladding layer 110, the active layer 108 with no impurity doped, and the n-type second cladding layer 106. Each of the first cladding layer 110 and the second cladding layer 106 has a forbidden band width larger than that of the active layer 108 and a refractive index smaller than that of the active layer 108. The active layer 108 has a function of amplifying the light. The first cladding layer 110 and the second cladding layer 106 have a function of sandwiching the active layer 108 to thereby confine injected carriers (electrons and holes) and the light therein.

As shown in, for example, FIG. 3, the contact layer 112 can be formed under the first cladding layer 110. As the contact layer 112, a layer having ohmic contact with the first electrode 122 can be used. The contact layer 112 is made of, for example, a second conductivity type semiconductor. As the contact layer 112, a p-type GaAs layer, for example, can be used.

The first electrode 122 is formed under the contact layer 112. The first electrode 122 is electrically connected to the first cladding layer 110 via the contact layer 112. The first electrode 122 is one of the electrodes for driving the light emitting element 100. As the first electrode 122, what is obtained by stacking a Cr layer, an AuZn layer, and an Au layer in this order from the side of the contact layer 112, for example, can be used. The upper surface of the first electrode 122 has a planar shape substantially the same as those of the gain regions 180, 182. In the example shown in the drawing, the current channel between the electrodes 122, 120 is determined in accordance with the planar shape of the contact surface between the first electrode 122 and the contact layer 112, and as a result, the planar shape of the gain regions 180, 182 can be determined. It should be noted that although not shown in the drawings, it is also possible that the contact surface between the second electrode 120 and the substrate 102 has a planar shape the same as those of the gain regions 180, 182.

The second electrode 120 is formed on the entire upper surface of the substrate 102. The second electrode 120 can have contact with the layer (the substrate 102 in the example shown in the drawings) having ohmic contact with the second electrode 120. The second electrode 120 is electrically connected to the second cladding layer 106 via the substrate 102 and the buffer layer 104. The second electrode 120 is the other of the electrodes for driving the light emitting element 100. As the second electrode 120, what is obtained by stacking a Cr layer, an AuGe layer, an Ni layer, and an Au layer in this order from the side of the substrate 102, for example, can be used. It should be noted that it is also possible to dispose a second contact layer (not shown) between the second cladding layer 106 and the buffer layer 104, expose the second contact layer on the side of the second cladding layer 106 using a dry etching process or the like, and then dispose the second electrode 120 under the second contact layer. Thus, a single-sided electrode structure can be obtained. As the second contact layer, an n-type GaAs layer, for example, can be used. Further, although not shown in the drawings, the substrate 102 and the member disposed under the substrate 102 can be separated from each other using, for example, an epitaxial liftoff (ELO) method or a laser liftoff method. In other words, it is also possible for the light emitting element 100 not to include the substrate 102. In this case, the second electrode 120 can be formed directly on the buffer layer 104, for example.

In the light emitting element 100, when applying a forward bias voltage of the pin diode between the first electrode 122 and the second electrode 120, there occurs recombination of electrons and holes in the gain regions 180, 182 of the active layer 108. The recombination causes the light emission. The stimulated emission begins at the light thus generated in a chained manner, and the light intensity is amplified inside the gain regions 180, 182. For example, some of the light generated in the second gain region 182 is reflected by the overlapping plane 178, and then emitted from a second end surface 172 of the first gain region 180 on the side of the second surface 109 as a first outgoing light beam L1, during which the light intensity is amplified. Similarly, some of the light generated in the first gain region 180 is reflected by the overlapping plane 178, and then emitted from a fourth end surface 176 of the second gain region 182 on the side of the second surface 109 as a second outgoing light beam L2, during which the light intensity is amplified. It should be noted that some of the light generated in the first gain region 180 is emitted directly from the second end surface 172 as the first outgoing light beam L1. Similarly, some of the light generated in the second gain region 182 is emitted directly from the fourth end surface 176 as the second outgoing light beam L2. The first outgoing light beam L1 can be emitted in a direction tilted with an angle larger than the tilt angle of the first gain region 180 with respect to the perpendicular P of the first surface 107 due to, for example, refraction of light. The tilt angle $\theta_A$ of the first gain region with respect to the perpendicular P of the first surface 107, a tilt angle $\theta_1$ of the first outgoing light beam L1, and the refractive index $n_A$ of the active layer 108 can satisfy the following formula.

$$n_A \sin \theta_A = \sin \theta_1$$

It should be noted that the formula described above can be derived using the Snell's law in the case in which the first outgoing light beam L1 is emitted from the active layer 108 to the air. The formula described above becomes true for other gain regions in the same manner.

As shown in FIGS. 2 and 3, the optical member 158 is disposed on the support member 140 and laterally to the light emitting element 100. The first outgoing light beam L1 and the second outgoing light beam L2, which are respectively emitted from the end surface 172 of the first gain region 180 and the end surface 176 of the second gain region 182 on the corresponding side (the side of the second surface 109 in the example shown in the drawings) of the active layer 108, enter the optical member 158. As shown in, for example, FIG. 2, a light entrance surface in the optical member 158 can be composed of a first entrance surface 162 and a second entrance surface 164. As shown in, for example, FIG. 2, the first entrance surface 162 can be tilted with respect to the proceeding direction of the first outgoing light beam L1 and the perpendicular Q thereof. Thus, the first outgoing light beam L1 is refracted by the optical member 158, and can proceed inside the optical member 158 as a first refracted light beam L3. Similarly, the second entrance surface 164 can be tilted with respect to, for example, the proceeding direction of the second outgoing light beam L2 and the perpendicular R thereof. Thus, the second outgoing light beam L2 is refracted by the optical member 158, and can proceed inside the optical member 158 as a second refracted light beam L4. Due to the tilt of the first entrance surface 162 and the second entrance surface 164, the intersection S therebetween projects toward the light emitting element 100 in, for example, a plan view of the light emitting device 1000 from a stacking direction of the active layer 108 (see FIG. 2). As shown in, for example, FIG. 2, the first entrance surface 162 and the second entrance surface 164 can be axisymmetrical with each other about a perpendicular bisector P of the overlapping plane 178.

As shown in FIG. 2, the first entrance surface 162 is tilted toward one side with respect to a direction (the Y direction shown in FIG. 2) parallel to the second surface 109 of the active layer 108. The tilt angle (sharp angle) of the first entrance surface 162 with respect to a direction parallel to the second surface 109 is denoted as $\theta_3$. The tilt angle $\theta_3$, the refractive index n of the optical member 158, and the tilt angle $\theta_1$ of the first outgoing light beam L1 with respect to a direction (the X direction shown in FIG. 2) of a perpendicular of the second surface 109 can satisfy, for example, the Formula 1 described below.

$$\sin(\theta_1+\theta_3)=n \sin \theta_3 \qquad (1)$$

Thus, it becomes possible to set the proceeding direction of the first refracted light beam L3 to the direction of the perpendicular of the second surface 109. It should be noted that the Formula 1 described above can be derived using the Snell's law in the case in which the first outgoing light beam L1 enters the optical member 158 from the air. Further, according to the Formula 1 described above, the tilt angle $\theta_3$ can be expressed, for example, as follows.

$$\theta_3=\tan^{-1}\{\sin \theta_1/(n-\cos \theta_1)\}$$

Further, as shown in FIG. 2, the second entrance surface 164 is tilted toward the other side with respect to the direction parallel to the second surface 109 of the active layer 108. The tilt angle (sharp angle) of the second entrance surface 164 with respect to the direction parallel to the second surface 109 is denoted as $\theta_4$. Similarly to the tilt angle $\theta_3$ of the first entrance surface 162, the tilt angle $\theta_4$ can be expressed, for example, as follows.

$$\theta_4=\tan^{-1}\{\sin \theta_2/(n-\cos \theta_2)\}$$

Thus, it becomes possible to set the proceeding direction of the second refracted light beam L4 to the direction of the perpendicular of the second surface 109. It should be noted that $\theta_2$ denotes the tilt angle of the second outgoing light beam L2 with respect to the direction of the perpendicular of the second surface 109. The tilt angle $\theta_1$ of the first outgoing light beam L1 and the tilt angle $\theta_2$ of the second outgoing light beam L2 are, for example, the same. Further, the tilt angle $\theta_3$ of the first entrance surface 162 and the tilt angle $\theta_4$ of the second entrance surface are, for example, the same.

In such a manner as described above, the proceeding directions of the first refracted light beam L3 and the second refracted light beam L4 can be aligned to, for example, the direction of the perpendicular of the second surface 109 of the active layer 108. In other words, the proceeding direction of the first refracted light beam L3 and the proceeding direction of the second refracted light beam L4 are, for example, the same. In the light emitting device 1000, for example, the first gain region 180 is disposed so as to be tilted toward one side with respect to the perpendicular P while the second gain region 182 is disposed so as to be tilted toward the other side. Therefore, the first outgoing light beam L1 proceeds in the direction tilted toward the one side with respect to the perpendicular P while the second outgoing light beam L2 proceeds in the direction tilted toward the other side. In accordance with the proceeding directions of the outgoing light beams L1, L2, the first entrance surface 162 is tilted toward the one side with respect to the direction (the Y direction shown in FIG. 2) parallel to the second surface 109 while the second entrance surface 164 is tilted toward the other side. Thus, the proceeding directions of the first refracted light beam L3 and the second refracted light beam L4 can be aligned to the direction (the X direction shown in FIG. 2) of the perpendicular of the second surface 109 of the active layer 108.

The first refracted light beam L3 having proceeded inside the optical member 158 can be emitted from the optical member 158 as a third outgoing light beam L5. Similarly, the second refracted light beam L4 having proceeded inside the optical member 158 can be emitted from the optical member 158 as a fourth outgoing light beam L6. As shown in, for example, FIG. 2, an exit surface 169 of the optical member 158 for the third outgoing light beam L5 and the fourth outgoing light beam L6 is parallel to the second surface 109 of the active layer 108. Therefore, the first refracted light beam L3 and the second refracted light beam L4 with the proceeding directions aligned to the direction of the perpendicular of the second surface 109 of the active layer 108 as described above can be emitted from the optical member 158 in, for example, the directions without any changes. In other words, the proceeding directions of the third outgoing light beam L5 and the fourth outgoing light beam L6 can be aligned to, for example, the direction of the perpendicular of the second surface 109 of the active layer 108.

In such a manner as described above, the optical member 158 is capable of refracting the first outgoing light beam L1 and the second outgoing light beam L2 proceeding in the respective directions different from each other to thereby emit them as the third outgoing light beam L5 and the fourth outgoing light beam L6 proceeding in the same direction.

It should be noted that the third outgoing light beam L5 and the fourth outgoing light beam L6 can proceed in the respective directions identical to each other and tilted with respect to the direction of the perpendicular of the second surface 109 of the active layer 108. The adjustment of the proceeding directions of the third outgoing light beam L5 and the fourth outgoing light beam L6 can be performed by appropriately adjusting the tilt angles of the first entrance surface 162 and the second entrance surface 164 in the optical member 158.

The optical member 158 can be provided with translucency to the wavelengths of the light beams L1, L2 emitted from the light emitting element 100. Thus, at least a part of the first outgoing light beam L1 can be transmitted through the optical member 158, and at least a part of the second outgoing light beam L2 can be transmitted through the optical member 158. The optical member 158 can be made of, for example, glass, quartz, plastic, or crystal. These materials can arbitrarily be selected in accordance with the wavelengths of the outgoing light beams L1, L2. Thus, the absorption loss of the light can be reduced.

The support member 140 can support, for example, the light emitting element 100 and the optical member 158. As the support member 140, a member having a plate-like shape (a rectangular solid shape), for example, can be used. The thermal conductivity of the support member 140 is higher than, for example, the thermal conductivity of the light emitting element 100. The thermal conductivity of the support member 140 is, for example, equal to or higher than 140 W/mK. The support member 140 can be made of, for example, Cu, Al, Mo, W, Si, C, Be, or Au, a compound (e.g., AlN, BeO) thereof, or an alloy (e.g., CuMo). Further, it is also possible to configure the support member 140 from a combination of these citations such as a multilayer structure of a copper (Cu) layer and a molybdenum (Mo) layer. It should be noted that the support member 140 can support the light emitting element 100 and the light emitting member 158 indirectly via another support member (sub-mount) not shown.

As shown in FIG. 3, the support member 140 is provided with a through hole 147 having, for example, a columnar shape. Inside the through hole 147, there is disposed a columnar terminal 144 having a side surface covered by an insulating member 146, for example. The insulating member 146 is made of, for example, resin or ceramics (e.g., AlN). The terminal 144 is made of, for example, copper (Cu).

The terminal 144 is connected to the second electrode 120 of the light emitting element 100 via a first connection member 142 such as a bonding wire. The first connection member 142 is disposed so as not to block the light paths of the outgoing light beams L1, L2. Further, the first electrode 122 of the light emitting element 100 is connected to the support member 140 via a second connection member 143 such as a plating bump. Therefore, by applying different potentials to the terminal 144 and the support member 140, a voltage can be applied between the first electrode 122 and the second electrode 120. It should be noted that in FIG. 2 the first connection member 142, the terminal 144, the insulating member 146, and the through hole 147 are omitted from illustration for the sake of convenience. This is applied to the plan view schematically showing the light emitting device according to the invention described below.

Although the case with a type of InGaAlP is explained hereinabove as an example of the light emitting device 1000 (the light emitting element 100), any type of material with which the light emitting gain region can be formed can be used as the light emitting device 1000. In the case of semiconductor materials, semiconductor materials such as an AlGaN type, an InGaN type, a GaAs type, an AlGaAs type, an InGaAs type, an InGaAsP type, or a ZnCdSe type can be used.

The light emitting device 1000 has following features, for example.

According to the light emitting device 1000, the optical member 158 is capable of refracting the first outgoing light beam L1 and the second outgoing light beam L2 proceeding in the respective directions different from each other to thereby emit them as the third outgoing light beam L5 and the fourth outgoing light beam L6 proceeding in the same direction. Thus, it becomes possible to simplify the configuration of the optical system (e.g., the equalizing optical systems 1002R, 1002G, and 1002B (see FIG. 1)) of the projector 10000 to thereby make the light axis adjustment easier in the projector 10000.

According to the light emitting device 1000, it is possible to determine the positions of the light entrance surfaces 162, 164 and the light exit surface 169 based on, for example, the second surface 109 of the active layer 108. Thus, it becomes possible to make the alignment between the light emitting element 100 and the optical member 158 easier.

According to the light emitting device 1000, some of the light generated in the first gain region 180 is reflected by the overlapping plane 178, and can also proceed inside the second gain region 182 while taking the gain, for example. Further, the same can be applied to some of the light generated in the second gain region 182. Therefore, according to the light emitting device 1000, since the distance for amplifying the light intensity becomes longer compared to the case in which, for example, the light is not actively reflected by the overlapping plane 178, the high light output can be obtained.

According to the light emitting device 1000, the thermal conductivity of the support member 140 can be set higher than the thermal conductivity of the light emitting element 100. Thus, the support member 140 can function as a heatsink. Therefore, in the light emitting device 1000, the heat radiation performance can be improved. Further, in the light emitting device 1000, the active layer 108 is disposed on the side of the support member 140 in the light emitting element 100. Thus, it becomes possible to provide the light emitting device 1000 further superior in heat radiation performance.

According to the light emitting device 1000, the laser oscillation of the light generated in the gain regions 180, 182 can be suppressed or prevented as described above. Therefore, the speckle noise can be reduced.

3. Method of Manufacturing Light Emitting Device

Figure 4:
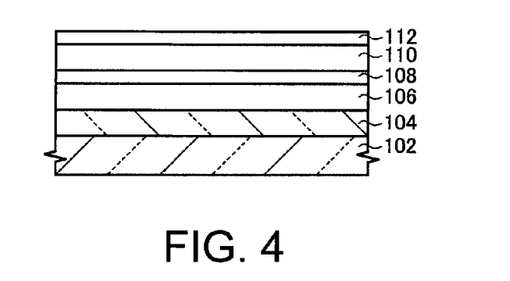
FIG. 4 is a cross-sectional view schematically showing a manufacturing process of the light emitting device used for the projector according to the present embodiment.
Figure 5:
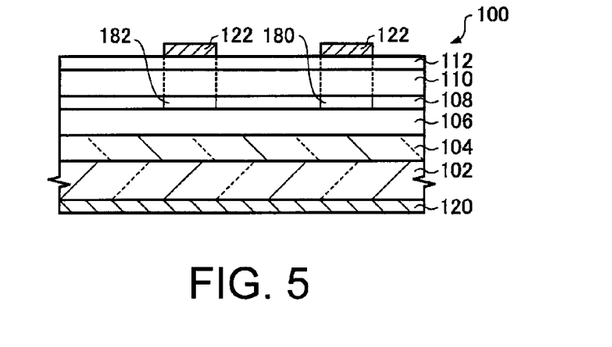
FIG. 5 is a cross-sectional view schematically showing the manufacturing process of the light emitting device used for the projector according to the present embodiment.

Then, a manufacturing method of the light emitting device 1000 used for the projector 10000 according to the present embodiment will be explained with reference to the accompanying drawings. FIGS. 4 and 5 are cross-sectional views schematically showing the manufacturing process of the light emitting device 1000.

Firstly, as shown in FIG. 4, the buffer layer 104, the second cladding layer 106, the active layer 108, the first cladding layer 110, and the contact layer 112 are grown epitaxially on the substrate 102 in this order. As the method of growing the layers epitaxially, a metal-organic chemical vapor deposition (MOCVD) method, a molecular beam epitaxy (MBE) method can be used, for example.

Subsequently, it is possible to form the reflecting section 130 on the entire area of the first surface 107, and to form the reflection reduction section (not shown) on the entire area of the second surface 109 as shown in FIG. 2. The reflecting section 130 and the reflection reduction section are formed using, for example, a chemical vapor deposition (CVD) method, a sputtering method, or an ion assisted deposition method.

Subsequently, as shown in FIG. 5, the first electrode 122 is formed on the contact layer 112. The first electrode 122 is formed by, for example, forming a conductive layer on the entire surface using a vacuum evaporation method, and then patterning the conductive layer using a photolithography technology and an etching technology. Further, the first electrode 122 can also be formed to have a desired shape using, for example, a combination of a vacuum evaporation method and a liftoff method.

Subsequently, as shown in FIG. 5, the second electrode 120 is formed on the entire lower surface of the substrate 102. The manufacturing method of the second electrode 120 is the same as, for example, what is shown as an example of the manufacturing method of the first electrode 122 described above. It should be noted that the order of forming the first electrode 122 and the second electrode 120 is not particularly limited.

According to the process described above, the light emitting element 100 can be obtained as shown in FIG. 5. Subsequently, the second connection member 143 can be formed on the first electrode 122 of the light emitting element 100 using, for example, a plating method.

Subsequently, as shown in FIG. 2, it is possible to mount the light emitting element 100 to the support member 140 in a flip-chip manner with the light emitting element 100 flipped, namely while making the active layer 108 side of the light emitting element 100 face the support member 140 (junction down). Subsequently, the second electrode 120 of the light emitting element 100 and the terminal 144 are connected to each other with the first connection member 142. This process is performed using, for example, wire bonding.

According to the process described hereinabove, the light emitting device 1000 can be manufactured.

4. Modified Examples of Light Emitting Device

Then, modified examples of the light emitting device used for the projector according to the present embodiment will be explained. Hereinafter, in each of the light emitting devices 1100, 1200, 1300, 1400, 1500, and 1600 according to the modified example, members having the same functions as those of the constituents of the light emitting device 1000 will be denoted by the same reference symbols, and detailed explanation thereof will be omitted.

4-1. Light Emitting Device According to First Modified Example

Figure 6:
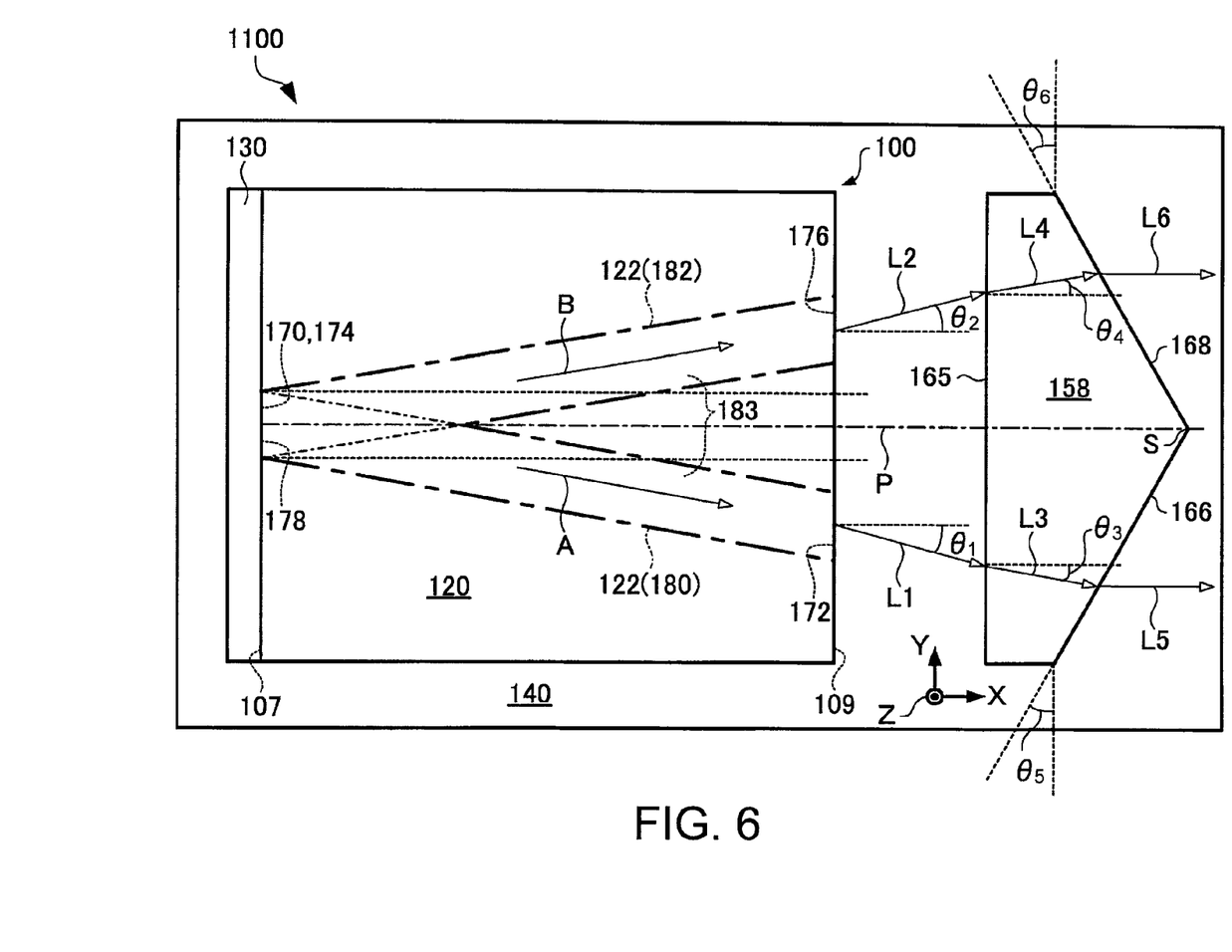
FIG. 6 is a plan view schematically showing a light emitting device of a first modified example used for the projector according to the present embodiment.

Firstly, a light emitting device 1100 according to a first modified example will be explained with reference to the accompanying drawings. FIG. 6 is a plan view schematically showing the light emitting device 1100.

In the example of the light emitting device 1000, there is explained the case in which as shown in, for example, FIG. 2, the light entrance surfaces 162, 164 in the optical member 158 are tilted with respect to the direction parallel to the second surface 109 of the active layer 108, and the exit surface 169 is not tilted. In contrast thereto, in the example shown in FIG. 6, it is possible to tilt the exit surface instead of tilting the light entrance surface 165 in the optical member 158 with respect to the direction parallel to the second surface 109 of the active layer 108. In the example shown in the drawing, the light exit surface in the optical member 158 can be formed of a first exit surface 166 and a second exit surface 168. The first exit surface 166 can be tilted with respect to, for example, the proceeding direction (the X direction) of the third outgoing light beam L5 and the perpendicular (the Y direction) thereof. Similarly, the second exit surface 168 can be tilted with respect to, for example, the proceeding direction (the X direction) of the fourth outgoing light beam L6 and the perpendicular (the Y direction) thereof. Due to the tilt of the first exit surface 166 and the second exit surface 168, the intersection S therebetween projects toward the side opposite to the side of the light emitting element 100 in, for example, a plan view (see FIG. 6). Further, as shown in FIG. 6, an entrance surface 165 of the optical member 158 for the first outgoing light beam L1 and the second outgoing light beam L2 is parallel to the second surface 109 of the active layer 108.

As shown in FIG. 6, the first exit surface 166 is tilted toward one side with respect to a direction (the Y direction) parallel to the second surface 109 of the active layer 108. The tilt angle (sharp angle) of the first exit surface 166 with respect to a direction parallel to the second surface 109 is denoted as $\theta_5$. The tilt angle $\theta_5$, the refractive index n of the optical member 158, and the tilt angle (refraction angle) $\theta_3$ of the first refracted light beam L3 with respect to a direction (the X direction) of a perpendicular of the second surface 109 can satisfy, for example, the Formula 2 described below.

$$n \sin(\theta_5 - \theta_3) = \sin \theta_5 \quad (2)$$

Thus, it becomes possible to set the proceeding direction of the third outgoing light beam L5 to the direction of the perpendicular of the second surface 109. It should be noted that the Formula 2 described above is derived using the Snell's law in the case in which the third outgoing light beam L5 is emitted from the optical member 158 to the air. Further, according to the Formula 2 described above, the tilt angle $\theta_5$ can be expressed, for example, as follows.

$$\theta_5 = \tan^{-1}\{n \sin \theta_3/(n \cos \theta_3 - 1)\}$$

It should be noted that the tilt angle $\theta_3$, the refractive index n of the optical member 158, and the tilt angle (an incident angle at the entrance surface 165) $\theta_1$ of the first outgoing light beam L1 with respect to a direction (the X direction) of a perpendicular of the second surface 109 can satisfy, for example, the Formula 3 described below according to the Snell's low.

$$\sin \theta_1 = n \sin \theta_3 \quad (3)$$

Further, as shown in FIG. 6, the second exit surface 168 is tilted toward the other side with respect to the direction parallel to the second surface 109 of the active layer 108. The tilt angle (sharp angle) of the second exit surface 168 with respect to the direction parallel to the second surface 109 is denoted as $\theta_6$. Similarly to the tilt angle $\theta_5$ of the first exit surface 166, the tilt angle $\theta_6$ can be expressed, for example, as follows.

$$\theta_6 = \tan^{-1}\{n \sin \theta_4/(n \cos \theta_4 - 1)\}$$

Thus, it becomes possible to set the proceeding direction of the fourth outgoing light beam L6 to the direction of the perpendicular of the second surface 109. It should be noted that $\theta_4$ denotes the tilt angle of the second refracted light beam L4 with respect to the direction of the perpendicular of the second surface 109. The tilt angle $\theta_5$ of the first exit surface 166 and the tilt angle $\theta_6$ of the second exit surface 168 are, for example, the same.

In such a manner as described above, the optical member 158 is capable of refracting the first outgoing light beam L1 and the second outgoing light beam L2 proceeding in the respective directions different from each other to thereby emit them as the third outgoing light beam L5 and the fourth outgoing light beam L6 proceeding in the same direction. It should be noted that although not shown in the drawings, it is also possible that the both of the entrance surface and the exit surface of the optical member 158 are tilted with respect to the direction parallel to the second surface 109 of the active layer 108.

According to the light emitting device 1100, similarly to the case of the light emitting device 1000, it is possible to refract the first outgoing light beam L1 and the second outgoing light beam L2 proceeding in the respective directions different from each other to thereby emit them as the third outgoing light beam. L5 and the fourth outgoing light beam L6 proceeding in the same direction.

4-2. Light Emitting Device According to Second Modified Example

Figure 7:
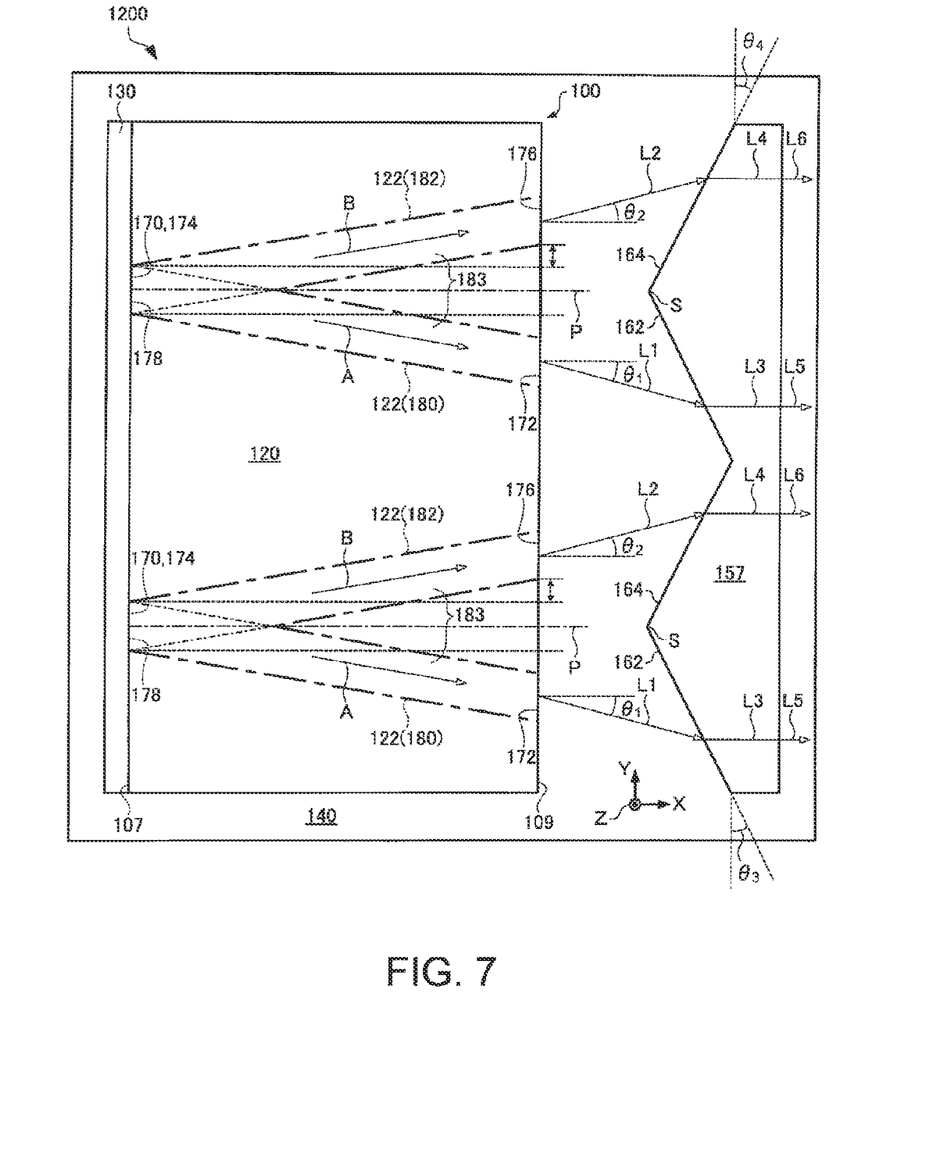
FIG. 7 is a plan view schematically showing a light emitting device of a second modified example used for the projector according to the present embodiment.

Then, a light emitting device 1200 according to a second modified example will be explained with reference to the accompanying drawings. FIG. 7 is a plan view schematically showing the light emitting device 1200.

In the example of the light emitting device 1000, there is explained the case in which a single V-shaped gain region 183 formed of the gain regions 180, 182 is provided as shown in FIG. 2. In contrast thereto, in the light emitting device 1200 a plurality (two in the example shown in FIG. 7) of the V-shaped gain regions 183 can be arranged. In the example shown in the drawing four light exit surfaces (two second end surfaces 172 and two fourth end surfaces 176) are all disposed on the side of the second surface 109. Directions (first directions) A along which the first gain regions 180 of the respective V-shaped gain regions 183 extend can be the same (as the example shown in the drawing), or different from each other. Similarly, directions (second directions) B along which the second gain regions 182 of the respective V-shaped gain regions 183 extend can be the same (as the example shown in the drawing), or different from each other. Further, the width of the first gain region 180 of each of the plurality of V-shaped gain regions 183 in the Y direction (the direction parallel to the first surface 107) can be the same (as the example shown in the drawing) or different between the V-shaped gain regions 183. Similarly, the width of the second gain region 182 of each of the plurality of V-shaped gain regions 183 in the Y direction can be the same (as the example shown in the drawing) or different between the V-shaped gain regions 183. Further, in the light emitting device 1200, as shown in FIG. 7, it is possible to eliminate overlaps between all of the second end surfaces 172 and the fourth end surfaces 176 in the light emitting device 1200.

As shown in FIG. 7, all of the light beams L1, L2, which are emitted from the end surfaces 172 of the first gain regions 180 and the end surfaces 176 of the second gain regions 182 of the plurality of V-shaped gain regions 183 on the same side (the side of the second surface 109) of the active layer 108, enter the optical member 157 of the light emitting device 1200. The optical member 157 can refract all these light beams L1, L2 to thereby emit them as the light beams L5, L6 proceeding in the same direction.

In the light emitting device 1200, it is possible to dispose one integrated optical member 157 for the plurality of V-shaped gain regions 183 as shown in FIG. 7. In the example shown in the drawing, the optical member 157 has a shape obtained by linking two optical members 158 of the example of the light emitting device 1000. The entrance surface of the single optical member 157 according to the present modified example is formed of two first entrance surfaces 162 and two second entrance surfaces 164. It should be noted that it is also possible to dispose a plurality of optical members 158 of the example of the light emitting element 1000 individually to the respective V-shaped gain regions 183.

In the light emitting device 1200, it is preferable that the optical member 157 is disposed close to the light emitting element 100, and it is further preferable that the optical member 157 has contact with the light emitting element 100. Alternatively, it is preferable to dispose the plurality of V-shaped gain regions 183 distant from each other so as not to have contact with each other. According to at least either one of these measures in arrangement, it becomes possible to separately input the first outgoing light beam L1 and the second outgoing light beam L2 to the first entrance surface 162 and the second entrance surface 164 of the corresponding optical member 157, respectively. In other words, it is possible to prevent the first outgoing light beam L1 emitted from one V-shaped gain region 183 and the second outgoing light beam L2 emitted from another V-shaped gain region 183 from entering the same entrance surface (either one of the first entrance surface 162 and the second entrance surface 164).

According to the light emitting device 1200, a higher output of the light emitting device can be achieved as a whole device compared to the example of the light emitting device 1000.

4-3. Light Emitting Device According to Third Modified Example

Figure 8:
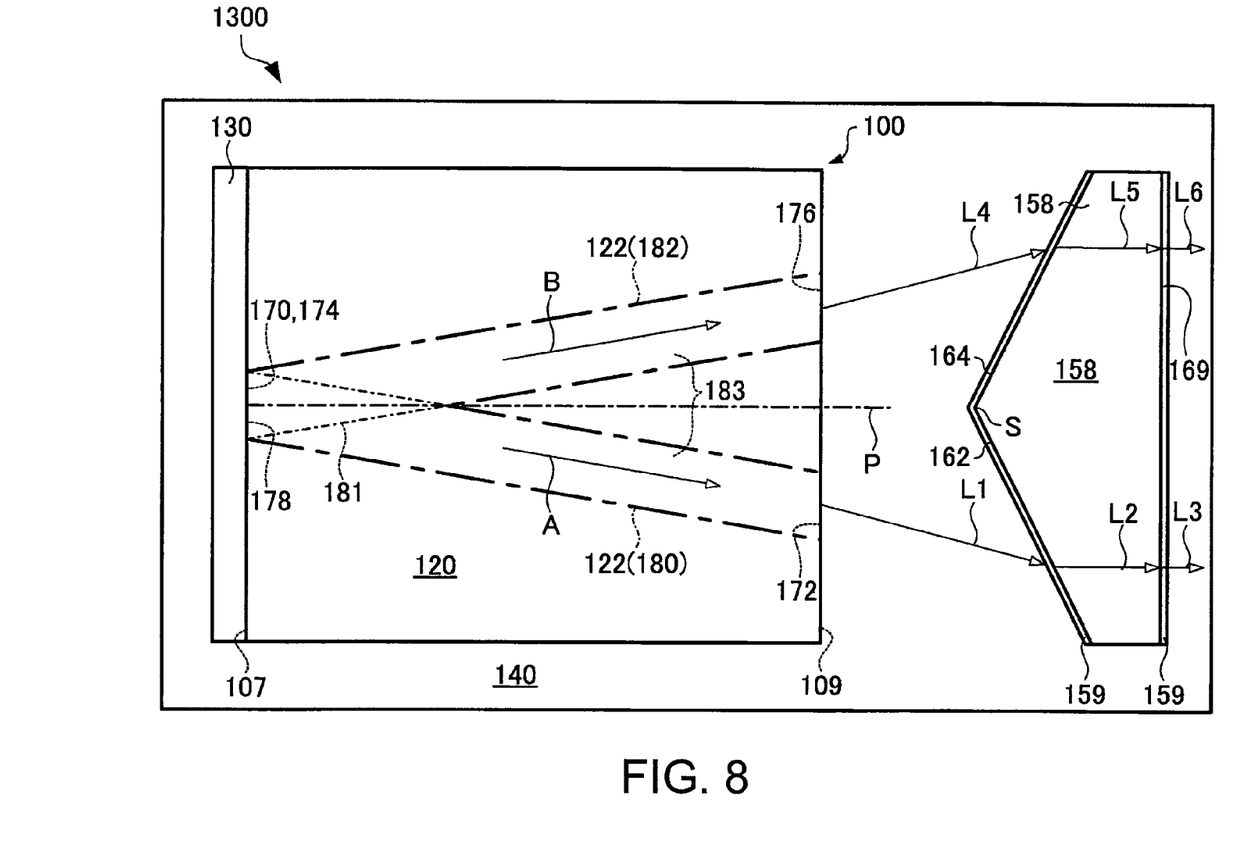
FIG. 8 is a plan view schematically showing a light emitting device of a third modified example used for the projector according to the present embodiment.

Then, a light emitting device 1300 according to a third modified example will be explained with reference to the accompanying drawings. FIG. 8 is a plan view schematically showing the light emitting device 1300.

In the example of the light emitting device 1000, there is explained the case in which the entrance surfaces 162, 164 and the exit surface 169 of the optical member 158 are exposed as shown in FIG. 2. In contrast thereto, in the light emitting device 1300, as shown in FIG. 8, it is possible to cover the light entrance surfaces 162, 164 and the exit surface 169 in the optical member 158 with a reflection reduction member 159. The reflection reduction member 159 can reduce the reflectance with respect to the wavelength of the light. Thus, the reflectance loss of the light can be reduced. It is not required to cover the entire area of the entrance surfaces 162, 164 and the exit surface 169 with the reflection reduction member 159, but is required only to cover at least light entrance area and exit area in the optical member 158. Further, it is also possible for the reflection reduction member 159 to cover at least either one of the light entrance area and the light exit area in the optical member 158. The reflection reduction member 159 can be made of at least one material with a refractive index different from that of the optical member 158. As the reflection reduction member 159, a laminated film of SiN and SiO$_2$ and so on can be used in the case in which, for example, the optical member 158 is made of glass. The reflection reduction member 159 is formed as a film using, for example, a CVD method.

According to the light emitting device 1300, as described above, the reflectance loss of the light can be reduced on the entrance surfaces 162, 164 and the exit surface 169 of the optical member 158.

4-4. Light Emitting Device According to Fourth Modified Example

Figure 9:
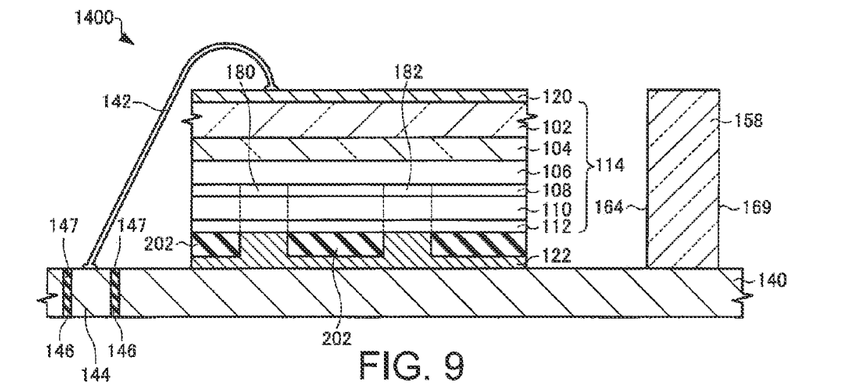
FIG. 9 is a cross-sectional view schematically showing a light emitting device of a fourth modified example used for the projector according to the present embodiment.

Then, a light emitting device 1400 according to a fourth modified example will be explained with reference to the accompanying drawings. FIG. 9 is a cross-sectional view schematically showing the light emitting device 1400. It should be noted that the cross-sectional view shown in FIG. 9 corresponds to the cross-sectional view shown in FIG. 3 in the example of the light emitting device 1000.

In the example of the light emitting device 1000, there is explained the case in which the first electrode 122 have the planar shape identical to that of the gain regions 180, 182 from the top to the bottom thereof. In contrast thereto, in the light emitting device 1400, the lower part of the first electrode 122 can be provided with a planar shape different from that of the gain regions 180, 182 as shown in FIG. 9. In the present modified example, it is possible to form an insulating layer 202 having an opening section under the contact layer 112, and then form the first electrode 122 filling the opening section. The first electrode 122 is formed inside the opening section and under the insulating layer (including the opening section) 202. In the present modified example, the upper part of the first electrode 122 has the planar shape identical to those of the gain regions 180, 182, and the lower part of the first electrode 122 has the planar shape identical to that of the insulating layer 202. As the insulating layer 202, for example, an SiN layer, an SiO$_2$ layer, and a polyimide layer can be used. The insulating layer 202 is formed as a film using, for example, a CVD method or a coating method. The first electrode 122 is bonded directly to the support member 140, for example. The bonding is performed using, for example, alloy bonding or bonding with solder paste.

According to the light emitting device 1400, since the volume of the lower part of the first electrode 122 can be increased compared to the example of the light emitting device 1000, it becomes possible to provide the light emitting device 1400 superior in heat radiation performance.

4-5. Light Emitting Device According to Fifth Modified Example

Figure 10:
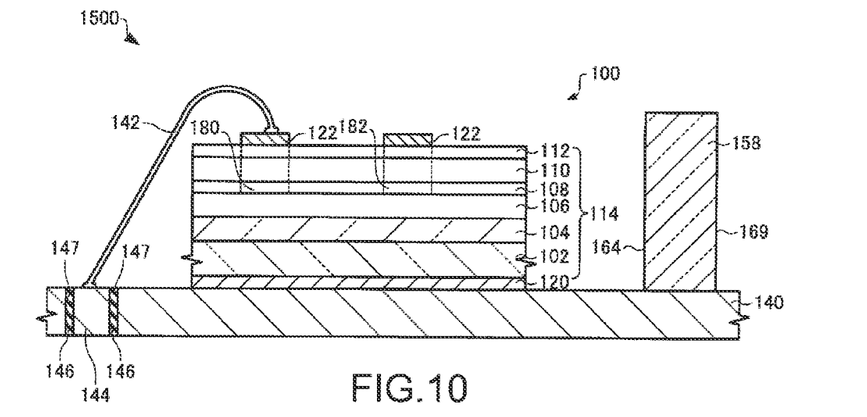
FIG. 10 is a cross-sectional view schematically showing a light emitting device of a fifth modified example used for the projector according to the present embodiment.

Then, a light emitting device 1500 according to a fifth modified example will be explained with reference to the accompanying drawings. FIG. 10 is a cross-sectional view schematically showing the light emitting device 1500. It should be noted that the cross-sectional view shown in FIG. 10 corresponds to the cross-sectional view shown in FIG. 3 in the example of the light emitting device 1000.

In the example of the light emitting device 1000, the active layer 108 is disposed on the side of the support member 140 in the light emitting element 100. In contrast thereto, in the light emitting device 1500, the active layer 108 is disposed on the side opposite to the support member 140 in the light emitting element as shown in FIG. 10. In other words, the active layer 108 is disposed on the upper side from the midpoint of the stacked structure of the light emitting element 100 in the thickness direction. In the light emitting device 1500, the substrate 102 is disposed between the active layer 108 and the support member 140. The second electrode 120 is bonded directly to the support member 140, for example. The bonding is performed using, for example, alloy bonding or bonding with solder paste. Further, the first electrode 122 is connected to the terminal 144 with, for example, the first connection member 142.

According to the light emitting device 1500, since the substrate 102 is disposed between the active layer 108 and the support member 140, the active layer 108 is disposed at the position at least by the thickness of the substrate 102 further from the support member 140 compared to the example of the light emitting device 1000. Therefore, the outgoing light beam with a much preferable shape (cross-sectional shape) can be obtained. If, for example, the radiation angle of the outgoing light beam from the gain regions 180, 182 is large, the outgoing light beam is blocked by the support member 140, and in some cases, the shape of the outgoing light beam might be distorted. In the light emitting device 1500, such a problem can be avoided.

4-6. Light Emitting Device According to Sixth Modified Example

Figure 11:
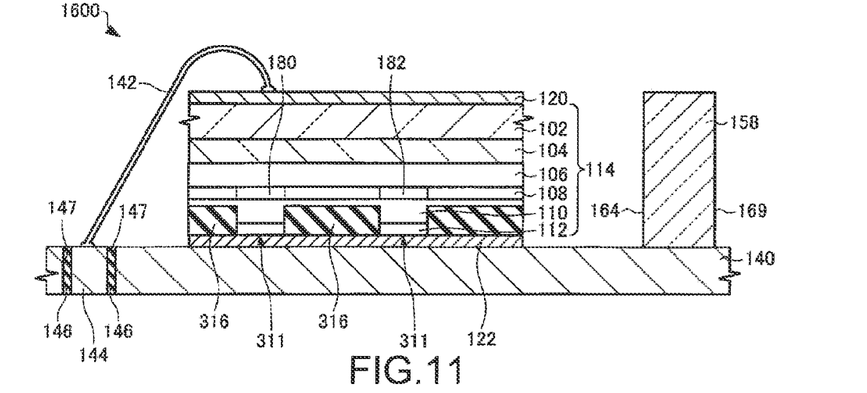
FIG. 11 is a cross-sectional view schematically showing a light emitting device of a sixth modified example used for the projector according to the present embodiment.

Then, a light emitting device 1600 according to a sixth modified example will be explained with reference to the accompanying drawings. FIG. 11 is a cross-sectional view schematically showing the light emitting device 1600. It should be noted that the cross-sectional view shown in FIG. 11 corresponds to the cross-sectional view shown in FIG. 3 in the example of the light emitting device 1000.

In the example of the light emitting device 1000, a so-called gain guide type is explained. In contrast thereto, the light emitting device 1600 can be a so-called refractive index guide type.

In other words, as shown in FIG. 11, in the light emitting device 1600, the contact layer 112 and a part of the first cladding layer 110 can constitute a columnar section 311. The planar shape of the columnar section 311 is the same as those of the gain regions 180, 182. The current channel between the electrodes 120, 122 is determined in accordance with the planar shape of the columnar section 311, for example, and as a result, the planar shapes of the gain regions 180, 182 are determined. It should be noted that although not shown in the drawings, the columnar section 311 can be composed of, for example, the contact layer 112, the first cladding layer 110, and the active layer 108, or composed further including the second cladding layer 106. Further, the side surfaces of the columnar section 311 can also be tilted.

An insulating section 316 is disposed on the side of the columnar section 311. The insulating section 316 can have contact with the side surfaces of the columnar sections 311. As the insulating section 316, for example, an SiN layer, an $SiO_2$ layer, and a polyimide layer can be used. The insulating section 316 is formed as a film using a CVD method or a coating method. The current between the electrodes 120, 122 can flow through the columnar section 311 surrounded by the insulating section 316 while avoiding the insulating section 316. It is possible for the insulating section 316 to have a refractive index smaller than the refractive index of the active layer 108. Thus, in the horizontal direction (the direction perpendicular to the thickness direction of the active layer 108), it becomes possible to efficiently confine the light inside the gain regions 180, 182.

It should be noted that the embodiment and the modified examples described above are each nothing more than an example, and the invention is not limited thereto. For example, it is also possible to arbitrarily combine the embodiment and the modified examples described above.

As described above, although the embodiment of the invention is hereinabove explained in detail, it should easily be understood by those skilled in the art that various modifications not substantially departing from the novel matters and the advantages of the invention are possible. Therefore, such modified examples should be included in the scope of the invention.

The entire disclosure of Japanese Patent Application No. 2009-217191, filed Sep. 18, 2009 is expressly incorporated by reference herein.

What is claimed is:

1. A projector comprising:
a light emitting device;
a light modulation device adapted to modulate a light beam emitted from the light emitting device in accordance with image information; and
a projection device adapted to project the image formed by the light modulation device,
wherein the light emitting device includes
a light emitting element, and
an optical member which a light beam emitted from the light emitting element enters,
the light emitting element is a super luminescent diode provided with a stacked structure having an active layer sandwiched between a first cladding layer and a second cladding layer,
at least a part of the active layer constitutes a first gain region and a second gain region,
a first surface and a second surface out of exposed surfaces of the active layer opposed to each other in the stacked structure,
the first gain region is disposed linearly from the first surface to the second surface of the active layer so as to be tilted in a clockwise direction with respect to a perpendicular of the first surface in a plan view along a stacking direction of the stacked structure,
the second gain region is disposed linearly from the first surface to the second surface of the active layer so as to be tilted in a counterclockwise direction with respect to a perpendicular of the first surface in the plan view along the stacking direction of the stacked structure, and
the optical member has a first planar surface in which the light beam emitted from an end surface located on a second surface side of the first gain region enters so as to be tilted toward one side with respect to the second surface, a second planar surface in which the light beam emitted from an end surface located on a second surface side of the second gain region enters so as to be tilted toward another side with respect to the second surface, and an exit planar surface that is parallel to the second surface and emits the light incident in the optical member, the optical member refracting the light beams emitted respectively from the end surface of the first gain region on the second surface side and the end surface of the second gain region on the second surface side to thereby emit the light beams as light beams proceeding in the same direction.

2. The projector according to claim 1, wherein the proceeding direction of the light beams emitted from the optical member is a direction of a perpendicular of the second surface.

3. The projector according to claim 1, wherein the first gain region and the second gain region constitute a V-shaped gain region in which an end surface of the first gain region on the first surface side and an end surface of the second gain region on the first surface side overlap each other on the first surface, and a reflectance of the first surface is higher than a reflectance of the second surface in a wavelength band of light generated in the first gain region and the second gain region.

4. The projector according to claim 1, wherein the number of the first gain region is more than one, and the number of the second gain region is more than one.

5. The projector according to claim 1, wherein the optical member has a translucency to a wavelength of the light beams emitted from the light emitting element.

6. The projector according to claim 1, wherein at least one of a light entrance area and a light exit area of the optical member is covered by a reflection reduction member.

7. The projector according to claim 1, wherein the light emitting element is mounted to a support member, a thermal conductivity of the support member is higher than a thermal conductivity of the light emitting element, and
the active layer is disposed on the support member side in the light emitting element.

8. The projector according to claim 1, wherein the light emitting element is mounted to a support member, the active layer is disposed on a side opposite to the support member side in the light emitting element, the stacked structure further includes a substrate, and the substrate is disposed between the active layer and the support member.

* * * * *